United States Patent [19]

Suzuki

[11] 4,264,872

[45] Apr. 28, 1981

[54] DIFFERENTIAL AMPLIFIERS UTILIZING MIS TYPE FIELD EFFECT TRANSISTORS

[75] Inventor: Shunichi Suzuki, Tokyo, Japan

[73] Assignee: Nippon Electric Co., Ltd., Tokyo, Japan

[21] Appl. No.: 94,693

[22] Filed: Nov. 16, 1979

[30] Foreign Application Priority Data

Nov. 28, 1978 [JP] Japan .................. 53/146853

[51] Int. Cl.³ .................. H03F 3/45; H03K 5/22
[52] U.S. Cl. .................. 330/253; 307/355
[58] Field of Search .......... 307/DIG. 3, 355, 362; 365/190, 202, 208; 330/253, 9

[56] References Cited

U.S. PATENT DOCUMENTS 3,882,326 5/1975 Kruggel .................. 307/355 X

Primary Examiner—James B. Mullins
Assistant Examiner—Gene Wan
Attorney, Agent, or Firm—Blakely, Sokoloff, Taylor & Zafman

[57] ABSTRACT

In a differential amplifier comprising a pair of transistors, these transistors comprise first and second MIS type field effect transistors with their gate electrode connected to a source through load resistors or MIS transistors, drain electrodes connected to input terminals respectively through serially connected capacitors and MIS type field effect transistors and source electrodes commonly connected to a source of constant current. One ends of the capacitors on the side of the input terminals are connected to the current source and the other ends of the capacitors are respectively connected to the drain electrodes of the pair of transistors through MIS transistors.

7 Claims, 5 Drawing Figures

DIFFERENTIAL AMPLIFIERS UTILIZING MIS TYPE FIELD EFFECT TRANSISTORS

BACKGROUND OF THE INVENTION

This invention relates to a differential amplifier utilizing a MIS (metal-insulator-semiconductor) type field effect transistor. A differential amplifier is generally used for amplifying read signals of an IC memory device or small signals of a linear circuit. However, as the offset level of the differential inputs is determined by the difference in the threshold value of the input MIS transistor and since the difference in the threshold value amounts to several tens millivolts it has been impossible to detect a small input.

A differential amplifier utilizing well known MIS transistors will firstly be described with reference to FIG. 1 in which the MIS transistors are of the N channel type. As shown, the drain electrodes of the N channel MIS transistors 11 and 12 are connected to resistors 13 and 14 respectively, the gate electrodes are connected to differential input terminals IN and $\overline{\text{IN}}$ respectively, and the source elecdodes are commonly connected to a source of constant current 15. This source 15 is not necessarily an ideal one but may be constituted by a MIS transistor having a gate electrode biased by a constant voltage, a grounded source electrode and a drain electrode connected to the source electrodes of the N channel MIS transistors 11 and 12.

While amplified differential outputs of opposite polarity are produced by the drain electrodes of the MIS transistors 11 and 12, when the characteristics of respective component elements are the same, the circuit would be symmetrical with respect to the differential inputs and the input offset would be zero. Actually, however, as there are many unbalances such as the differences in the resistance value of the load resistors 13 and 14, and in the threshold values and the conductances of the MIS transistors 11 and 12 the characteristics of the inverters constituted by said transistors on the left and right sides becomes different. Among the factors that cause asymmetry, the most serious one is the difference in the threshold values of the transistors 11 and 12. For example, when this difference is 50 millivolts, the input offset would be equal to at least 50 millivolts. With the present level of MIS integrated circuit technique, other factors can be reduced to negligibly small value. If one can reduce the input offset to substantially zero regardless of the difference in the threshold values of the transistors, the MIS type differential amplifiers could be used in various applications including various sensors.

SUMMARY OF THE INVENTION

Accordingly, it is the principal object of this invention to provide an improved differential amplifier utilizing MIS transistors and having a high sensitivities and capable of decreasing the input offset level to an extremely small level.

Another object of this invention is to provide a high sensitivity differential amplifier which can compensate for the difference in the threshold values of a pair of MIS transistors comprising the differential amplifier.

Still another object of this invention is to provide a differential amplifier utilizing MIS transistors and is suitable for use as a capacitor coupled type differential amplifier and a converter having a high sensitivity and a small input offset.

These and other objects of the invention can be accomplished by providing a differential amplifier comprising a first MIS type field effect transistor having a drain electrode connected to a first source through first load means, and a gate electrode connected to a first terminal of a first capacitor; a second MIS type field effect transistor having a drain electrode connected to the first source through second load means, and a gate electrode connected to a first terminal of a second capacitor; a current source for supplying current to source electrodes of the first and second MIS transistors; a third MIS type field effect transistor for interconnecting the drain and gate electrodes of the first transistor; a fourth MIS type field effect transistor for interconnecting the gate and drain electrodes of the second transistor; a fifth MIS type field effect transistor for connecting a second terminal of the first capacitor to a first input terminal; a sixth MIS type field effect transistor for connecting a second terminal of the second capacitor to a second input terminal; output terminal means connected to the drain electrode of the first or second transistors; means controlled by a first clock signal for setting the second terminals of the first and second capacitors to the same potential; means for applying the first clock signal to the gate electrodes of the third and fourth transistors; and means for applying a second clock signal to the gate electrodes of the fifth and sixth transistors, the second clock signal being not substantially overlapping the first clock signal.

The first and second load means comprise resistors or MIS transistors.

DESCRIPTION OF THE PREFERRED EMBODIMENTS

Figure 1:
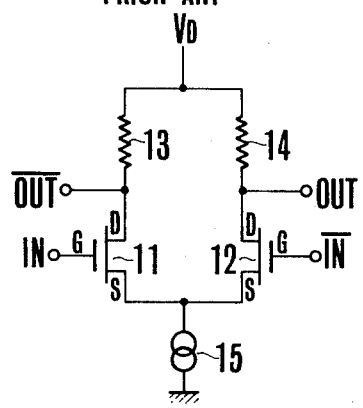
FIG. 1 is a connection diagram showing the basic construction of a typical prior art differential amplifier utilizing MIS type field effect transistors.
Figure 2:
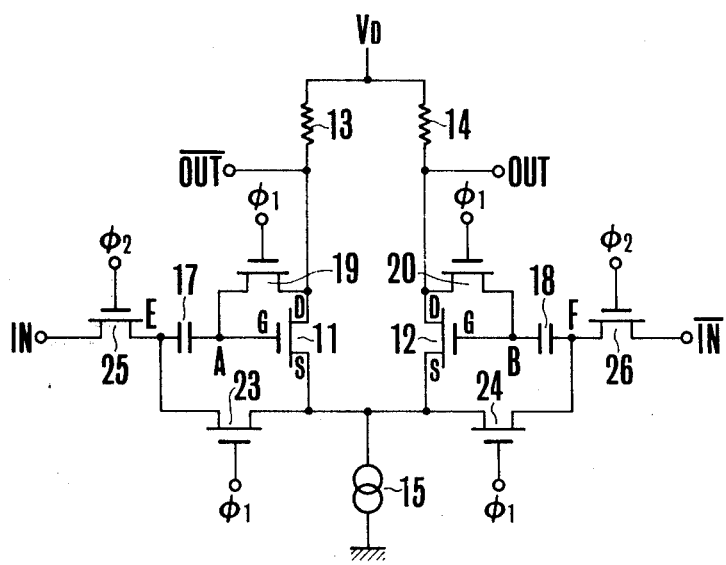
FIG. 2 is a connection diagram of one embodiment of the sense or differential amplifier utilizing MIS type field effect transistors and constructed according to the teaching of this invention.

In a preferred embodiment of the differential amplifier shown in FIG. 2, like parts corresponding to those shown in FIG. 1 are designated by the same reference characters. In this embodiment, an N channel MIS type first field effect transistor 11 utilized in the differential amplifier has a drain electrode connected to a first source $V_D$ via a first load resistor 13, a gate electrode connected to a first capacitor 17 at point A and a source electrode connected to a source of constant current 15. The drain electrode of the second N channel MIS type field effect transistor 12 is connected to the first source $V_D$ via a second load resistor 14, the gate electrode is connected to a second capacitor 18 at point B, and the source electrode is connected to the source of constant current 15 just like the source electrode of the first transistor 11. The drain electrodes of the transistors 11 and 12 comprise a pair of differential output terminals and they are connected to the gate electrodes of the same transistors 11 and 12 via N channel MIS type field effect transistors 19 and 20 respectively. The gate electrodes of these transistors are controlled by a first clock pulse signal $\phi 1$. In this embodiment, the points E and F at the other ends of capacitors 17 and 18 are connected to the source of constant current 15 via N channel MIS type field effect transistors 23 and 24 respectively. The gate electrodes of these transistors 23 and 24 are controlled by the first clock pulse signal $\phi 1$. Therefore, points E and F are biased by a constant voltage while points A and B are precharged by the first clock pulse signal $\phi 1$ via transistors 19 and 20 respectively. The points E and F at the other ends of capacitors 17 and 18 are connected to the source of constant current 15 via N channel MIS type field effect transistors 23 and 24 respectively. The gate electrodes of these transistors 23 and 24 are controlled by the first clock pulse signal $\phi 1$.

Points E and F are connected to an input terminal IN and an inverted input terminal $\overline{IN}$ respectively through MIS type field effect transistors 25 and 26 and their gate electrodes are controlled by a second clock pulse signal $\phi 2$ which does not overlap the first clock pulse signal $\phi 1$. In other words, no signal is applied to points E and F during the precharging interval and the points E and F sense the input signals applied to the input terminals in response to the second clock pulse signal $\phi 2$ after the precharging. Consequently, the relationship between the first and second clock pulse signals $\phi 1$ and $\phi 2$ and the operation mode can be shown by FIG. 3.

Figure 3:
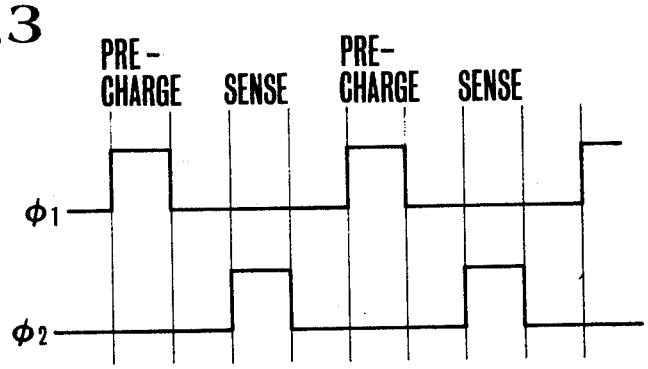
FIG. 3 is a graph useful to explain the relationship between first and second clock signals $\phi 1$ and $\phi 2$ supplied to the differential amplifier shown in FIG. 2 and the operating mode.

The detail of the operation of the differential amplifier will now be described with reference to FIGS. 2 and 3. When the first clock signal $\phi 1$ is at the precharge mode of a high level, since the transistors 19 and 20 are conductive and hence the drain and gate electrodes of the transistors 11 and 12 are short-circuited so that these transistors 11 and 12 would operate as if their threshold values correspond to the foreward voltage drop of a diode. Let us assume that the threshold values of the transistors 11 and 12 are represented by $V_{T1}$ and $V_{T2}$ respectively and that $$V_{T1} = V_{T2} + \Delta V_T, \ \Delta V_T > 0$$

In the prior art sense amplifier $\Delta V_T$ itself represents the minimum offset of the inputs.

However, in the construction shown in FIG. 2, during the precharging operation, since transistors 23 and 24 are rendered conductive by the clock signal $\phi 1$ applied to their gate electrodes, the potentials at points A and B are higher than their commonly connected source electrodes by $V_{T1}$ and $V_{T2}$ respectively. At this time, the potentials at points E and F should be the same potential. Thus, in this case, the potentials at points E and F are the same as that of the commonly connected source electrodes.

Thus, as a result of the precharging, point A is precharged to a potential higher than that of point B by $\Delta T$. When the inputs are sensed while maintaining this potential difference the input offset would become substantially zero.

After precharging, the first clock signal $\phi 1$ is changed to a low level to turn off transistors 19, 20, 23 and 24. Transistors 25 and 26 are turned ON by second clock pulse $\phi 2$ to apply the input signals to points E and F through input terminals IN and $\overline{IN}$ respectively.

Assume now that each of the capacitors C1 and C2 has a capacitance 2 pF, this capacitance is considerably larger than the parasitic capacitance of about 0.2 pF at points A and B. Therefore, the input signals are transmitted to points A and B according to an equation $$C1/(C_A+C1) = C2/(C_B+C2) = 10/11$$

Although the attenuation rate can be reduced by selecting larger C1 and C2, an attenuation rate of the order described above is sufficient because the inputs are amplified by amplifiers.

There is also a possibility of producing an input offset unless the differential amplifier is designed such that the ratios $C2/(C1+C_A)$ and $C2/(C2+C_B)$ are equal, but the relative accuracy of the capacitors in an integrated circuit which is arranged in a limited space is extremely high and with the present day technique, it is possible to limit the relative error to be less than 1%. Accordingly, when compared with the input offset caused by the difference in the threshold values, the input offset caused by the input capacitance and the parasitic capacitance is negligibly small.

The input signals transmitted to points A and B are amplified at once by the differential amplifier in the same manner as prior art technique.

While in the foregoing embodiment, points E and F were connected to the source of constant current 15 at the time of precharging, it is desirable that the precharging level at points E and F will be substantially equal to the level of the input signals applied to the input terminals when one considers the magnitude of the common mode of the input signals. This increases the dynamic range of the sense amplifier. More particularly, when the input common mode voltage is at about 1 volt, the precharge level at points E and F may be equal to the ground level, whereas when the input common mode voltage is at a level close to the voltage of the source $V_D$ the precharge level of points E and F may be equal to that of the source $V_D$. Where it is impossible to install a suitable bias source in the differential amplifier a separate precharging source may be provided for points E and F which can be used as a source of constant current commensurate for the transistors 23 and 24.

Figure 4:
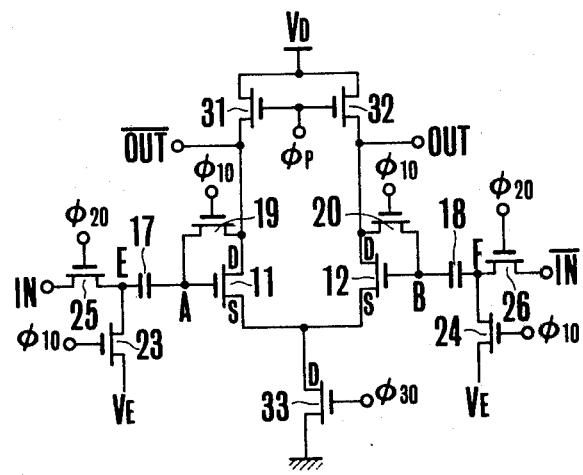
FIG. 4 is a connection diagram showing a modified embodiment of this invention as applied to a dynamic type sense amplifier.

FIG. 4 illustrates another embodiment of this invention in which a dynamic circuit is used for the purpose of decreasing the operating power. To aid understanding, in the following description, elements corresponding to those shown in FIG. 2 are designated by the same reference characters.

The drain electrode of the transistor 11 is connected to the source $V_D$ through a N channel MIS type load transistor 31, whereas the gate electrode is connected to an input capacitor 17 at point A and the source electrode to the drain electrode of a transistor 33 that constitutes a source of constant current.

The drain electrode of transistor 12 is connected to the source $V_D$ via a N channel MIS type load transistor 32, its gate electrode is connected to an input capacitor 18 at point B, and its source electrode to the drain electrode of a transistor 33. The drain electrodes of the transistors 11 and 12 that constitute differential output terminals are connected to the gate electrodes of the same transistors via transistors 19 and 20 controlled by a first clock signal $\phi 10$ (see FIG. 5) applied to their gate electrodes. While points A and B are being precharged by the first clock signal φ10 via transistors 19 and 20 respectively, in this embodiment, for the purpose of biasing points E and F on the other sides of the input capacitors 17 and 18 by a constant voltage, these points are connected to a source $V_E$ via transistors 23 and 24 respectively, with the result that the gate electrodes of transistors 23 and 24 are controlled by the first clock signal φ10. The two points E and F are connected to the input terminals IN and $\overline{\text{IN}}$ respectively through transistors 25 and 26, the gate electrodes thereof being supplied with a second clock signal φ20 which does not overlap the first clock signal φ10. In other words, no input signal is applied to points E and F during precharging so that after the precharging, the input signals IN and $\overline{\text{IN}}$ are sensed by the second clock signal φ20.

Figure 5:
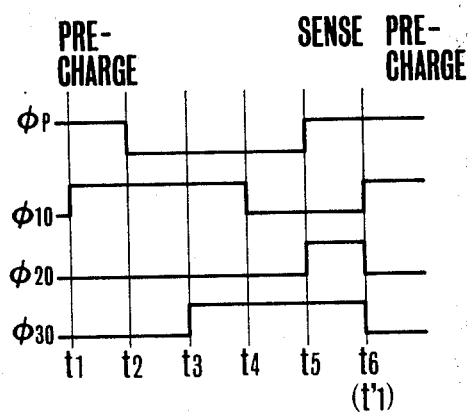
FIG. 5 shows waveforms of clock signals supplied to the differential amplifier shown in FIG. 4.

The operation of the sense amplifier shown in FIG. 4 will be described as follows by using the clock signal waveforms shown in FIG. 5.

The interval between times t1 and t2 corresponds to a precharge mode in which the load transistors 31 and 32 and transistors 19, 20, 23 and 24 are rendered conductive to charge various portions of the sense amplifier to a voltage near that of the source $V_D$.

At time t2, the level of a pulse φp is lowered to cut off load transistors 31 and 32 and at time t3, the level of a pulse φ30 is raised to render conductive the transistor 33. The gate and drain electrodes of transistors 11 and 12 are discharged, whereas the level of the gate and drain electrodes of transistor 11 is set to the threshold value $V_{T1}$ thereof and the level of the gate and drain electrodes of the transistor 12 to the threshold value $V_{T2}$ of transistor 12.

Meanwhile the levels at points E and F are equal to the voltage level of the source $V_E$. When transistors 19 and 20 are turned off at time t4 by lowering the level of points E and F the gate electrodes of transistors 11 and 12 will be biased to their threshold values with respect to their source electrodes.

Then at time t5 when the pulse φ20 becomes a high level to turn on the transistors 25 and 26, input signals would be applied to points E and F respectively through input terminals IN and $\overline{\text{IN}}$. Let us denote by $V_{IN}$ the parasitic capacitance between points A and B except the capacitance C1 of capacitor 17 by $C_A$ and the potential at the input terminal IN which is supplied with an input signal. Then the potential of point A is expressed by $$V_{T1}+(C1/(C1+C_A))\times(V_{\overline{IN}}-V_E)$$

By denoting the parasitic capacitance between points B and F except the capacitance C2 of the capacitor 18 by $C_B$, the potential of point B can be expressed as follows where $V_{IN}$ represents the potential of the input terminal $\overline{\text{IN}}$ supplied with an input signal.

$$V_{T2}+(C2/(C2+C_B))\times(V_{\overline{IN}}-V_E)$$

Thus, the signal levels at points A and B compensate for the difference in the threshold values of transistors 11 and 12. Assume now that the input capacitances C1 and C2 have capacitances of 2 pF, the input signals would be transmitted to points A and B without any appreciable attenuation since the paractic capacitances $C_A$ and $C_B$ are about 0.2 pF. As can be noted from the signal levels at points A and B, it is advantageous to set the voltage of the source $V_E$ so as to cancel the common mode signal of the input signals, thus maximizing the dynamic range of the differential amplifier.

The interval between times t5 and t6 corresponds to the sense mode so that at the same time when the input signals are transmitted to points A and B, the clock pulse φp becomes a high level to constitute a conventional differential amplifier producing amplified outputs on output terminals OUT and $\overline{\text{OUT}}$. Time t6 can be considered as the starting point of the precharge mode, that is a time one cycle after time t1 and the precharging is commenced by the clock pulse φ10.

It is to particularly noted that the sense amplifier consumes an extremely small power and has a high sensitivity because a direct current path from the source $V_D$ is established only between t4 and t5 and no current flows in another interval.

As above described, the present invention provides a highly sensitive differential amplifier wherein the variation in the threshold value of the input transistor can be compensated for.

It should be understood that the invention is not limited to the embodiments described above and many changes and modifications would be obvious to one skilled in the art. Thus for example although in the embodiments shown in FIGS. 2 and 4 N channel MIS type field effect transistors were used it is clear that these transistors can be substituted by P channel MIS type field effect transistors without any modification of the circuit arrangement. Further, it is possible to substitute transistors 13 and 14 with MIS transistors. Although it has be described that signals applied to an input terminal IN and an inverted input terminal IN were supplied from a single source, it is also possible to supply a reference voltage to one of the input terminals and to supply an input signal to the other input terminal.

What is claimed is:

1. A differential amplifier comprising:
   a first MIS type field effect transistor having a drain electrode connected to a first source through first load means, and a gate electrode connected to a first terminal of a first capacitor;
   a second MIS type field effect transistor having a drain electrode connected to said first source through second load means, and a gate electrode connected to a first terminal of a second capacitor;
   a current source for supplying current to source electrodes of said first and second transistors;
   a third MIS type field effect transistor for interconnecting the drain and gate electrodes of said first MIS transistor;
   a fourth MIS type field effect transistor for interconnecting the gate and drain electrodes of said second transistor;
   a fifth MIS type field effect transistor for connecting a second terminal of said first capacitor to a first input terminal;
   a sixth MIS type field effect transistor for connecting a second terminal of said second capacitor to a second input terminal;
   output terminal means connected to the drain electrode of said first or second transistors;
   means controlled by a first clock signal for setting the second terminals of said first and second capacitors to the same potential;
   means for applying said first clock signal to the gate electrodes of said third and fourth transistors; and
   means for applying second clock signal to the gate electrodes of the fifth and sixth transistors, said second clock signal being not substantially with said overlapping first clock signal.

2. A differential amplifier according to claim 1 wherein said means controlled by said first clock signal comprises a seventh MIS type field effect transistor connected between said second terminal of said first capacitor and a source of precharging, an eighth MIS type field effect transistor connected between the second terminal of said second capacitor and said precharging source; and means for applying said first clock signal to gate electrodes of said seventh and eighth transistors.

3. A differential amplifier according to claim 2 wherein said current source is used as said precharge source.

4. A differential amplifier according to claim 1 wherein each of said first and second load means comprises a resistor.

5. A differential amplifier according to claim 1 wherein each of said first and second load means comprises a MIS type field effect transistor.

6. A differential amplifier according to claim 5 which further comprises means for applying a third clock signal to said load transistors in a precharge mode, said third clock signal being synchronous with said first clock signal.

7. A differential amplifier according to claim 1, 5 or 6 wherein said current source comprises a MIS type field effect source transistor connected between the source electrodes of said first and second transistors and a point of reference potential and wherein a fourth clock signal synchronous with said second clock signal is applied to a gate electrode of said source transistor in a sense mode for turning on said transistor.

* * * * *